(12) United States Patent
Fukiage et al.

(10) Patent No.: US 8,259,526 B2
(45) Date of Patent: Sep. 4, 2012

(54) SEMICONDUCTOR DEVICE PERFORMING SERIAL PARALLEL CONVERSION

(75) Inventors: Takahiko Fukiage, Chuo-ku (JP); Atsushi Shimizu, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 473 days.

(21) Appl. No.: 12/627,768

(22) Filed: Nov. 30, 2009

(65) Prior Publication Data

US 2011/0029762 A1 Feb. 3, 2011

(30) Foreign Application Priority Data

Jul. 31, 2009 (JP) ................................ 2009-179616

(51) Int. Cl.
*G11C 7/00* (2006.01)
(52) U.S. Cl. ................ 365/221; 365/189.17; 365/233.1
(58) Field of Classification Search ............. 365/189.04, 365/189.05, 189.17, 194, 220, 221, 230.03, 365/233.1
See application file for complete search history.

(56) References Cited

U.S. PATENT DOCUMENTS

| | | | | |
|---|---|---|---|---|
| 5,426,606 A | * | 6/1995 | Takai ....................... 365/189.05 |
| 5,812,492 A | * | 9/1998 | Yamauchi et al. ......... 365/233.5 |
| 5,943,254 A | * | 8/1999 | Bakeman et al. ................ 365/72 |
| 6,118,729 A | | 9/2000 | Hirabayashi et al. |
| 6,181,174 B1 | * | 1/2001 | Fujieda et al. ................ 327/158 |
| 6,512,719 B2 | | 1/2003 | Fujisawa et al. |
| 6,671,787 B2 | * | 12/2003 | Kanda et al. .................. 711/167 |
| 6,813,696 B2 | * | 11/2004 | Kanda et al. .................. 711/167 |

FOREIGN PATENT DOCUMENTS

| | | |
|---|---|---|
| JP | 11-195296 A | 7/1999 |
| JP | 2001-050177 A | 2/2001 |
| JP | 2002-025265 A | 1/2002 |
| JP | 2002-050177 A | 2/2002 |

* cited by examiner

*Primary Examiner* — Gene Auduong
(74) *Attorney, Agent, or Firm* — Sughrue Mion, PLLC

(57) ABSTRACT

A first transfer circuit includes pipeline circuits having different number of stages, and switch circuits that exclusively supply the pipeline circuits with first and second read data. A second transfer circuit includes pipeline circuits having different number of stages, and switch circuits that exclusively supply the pipeline circuits with third and fourth read data. Outputs of the first and second transfer circuits are sequentially output from a multiplex circuit. When a first operation mode is selected, all the pipeline circuits are activated. When a second operation mode is selected, one of the pipeline circuits in the first transfer circuit and one of the pipeline circuits in the second transfer circuit are activated, whereas the others of the pipeline circuits are inactivated.

25 Claims, 7 Drawing Sheets

SEMICONDUCTOR DEVICE PERFORMING SERIAL PARALLEL CONVERSION

BACKGROUND OF THE INVENTION

1. Field of the Invention

The present invention relates to a semiconductor device, and more particularly relates to a semiconductor device that serially outputs parallel internal signals to outside.

2. Description of Related Art

Recently, synchronous DRAM (Dynamic Random Access Memory) that operates in synchronization with a clock has become the mainstream of DRAM. Although the clock speed used for the synchronous DRAM has been increasing year by year, it is impossible to increase the speed of a DRAM core (back-end circuit) proportionally to the clock frequency, because a pre-charge operation, a sense operation, and the like are necessary. Therefore, the synchronous DRAM has a "prefetch circuit" provided between the DRAM core (back-end circuit) and an interface unit (front-end circuit) that is connected to an input/output terminal and operates in synchronization with the clock frequency, and realizes an apparent high-speed operation by causing the prefetch circuit to perform parallel-to-serial conversion (see Japanese Patent Application Laid-open No. 2002-50177).

In a DDR1 synchronous DRAM, for example, the prefetch circuit performs a 2-bit prefetch, whereas in a DDR2 synchronous DRAM, the prefetch circuit performs a 4-bit prefetch. A high data transfer rate to the outside is realized in this manner.

The DDR1 and DDR2 synchronous DRAMs are basically different products because of the difference in prefetch numbers, and thus are designed, developed, and produced separately from each other. However, it is considered that the production costs can be reduced by configuring these DRAMs with the same chip and enabling to select whether it is used as the DDR1 or DDR2 synchronous DRAM. In this case, however, there is a problem as to how an internal circuit such as a pre-decoding circuit achieves compatibility.

This problem arises not only when integrating the DDR1 and DDR2 synchronous DRAMs into a single chip but also when integrating a plurality of specifications for outputting parallel internal signals serially to the outside into a single chip.

SUMMARY

The present invention seeks to solve one or more of the above problems, or to improve upon those problems at least in part.

In one embodiment, there is provided a semiconductor device having a first transfer circuit, the first transfer circuit comprising: first to third nodes; a first pipeline circuit including an input node, an output node and a predefined number of delay circuits respectively controlled by a synchronization signal; a second pipeline circuit including an input node, an output node and a larger number of delay circuits than the number of the delay circuits in the first pipeline circuit; and first to fourth switches controlled based on first to fourth control signals, respectively, wherein the first and second nodes receive first and second data, respectively in parallel, the first switch is connected between the first node and the input node of the first pipeline circuit, the second switch is connected between the second node and the input node of the first pipeline circuit, the third switch is connected between the first node and the input node of the second pipeline circuit, the fourth switch is connected between the second node and the input node of the second pipeline circuit, each of the output terminals of the first and second pipeline circuits is connected to the third node, in a first operation mode, either the first and fourth control signals or the second and third control signals are activated by a first address signal, whereby the first and second data are sequentially output to the third node as serial data via the first and second pipeline circuits corresponding thereto, respectively and, in a second operation mode, one of the first and second control signals is activated by the first address signal and the third and fourth control signals are fixed to an inactive state, whereby one of the first and second data is output to the third node via the first pipeline circuit.

In another embodiment, there is provided a semiconductor device comprising: first to fourth amplifiers that output first to fourth output signals in parallel, respectively; a first transfer circuit including a first output node, a first pipeline circuit that transfers one of the first and second output signals to the first output node at a first timing, and a second pipeline circuit that transfers the other of the first and second output signals to the first output node at a second timing which is different from the first timing; a second transfer circuit including a second output node, a third pipeline circuit that transfers one of the third and fourth output signals to the second output node at a third timing, and a fourth pipeline circuit that transfers the other of the third and fourth output signals to the second output node at a fourth timing which is different from the third timing; a multiplex circuit that converts signals output in parallel from the first and second output nodes into a serial signal; and a control circuit that controls operations of at least the first and second transfer circuits, wherein the control circuit in a first operation mode causes the first to fourth output signals to be serially output from the multiplex circuit by operating the first to fourth pipeline circuits in parallel, and the control circuit in a second operation mode causes one of the first and second output signals and one of the third and fourth output signals to be serially output from the multiplex circuit by operating the first and third pipeline circuits in parallel and stopping the operations of the second and fourth pipeline circuits.

According to the present invention, it is possible to integrate, into a single chip, the plurality of specifications for serially outputting the parallel internal signals to the outside while minimizing complexity of the circuit configuration by switching the operations of the pipeline circuits included in the transfer circuits according to the operation modes.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Typical examples of technical ideas for solving the problem of the present invention are shown below. However, the scope of the invention is not limited to the technical ideas and is defined by the appended claims. That is, a typical technical idea of the invention focuses on a fact that a first pipeline circuit having a smaller number of stages and a second pipeline circuit having a larger number of stages synchronized with a synchronization signal are included in a plurality of pipeline circuits within a transfer circuit, and uses the first and second pipeline circuits in parallel when a first operation mode is selected while using only the first pipeline circuit having a smaller number of stages when a second operation mode is selected. An operation mode selected from a plurality of operation modes is thereby realized. Accordingly, a chip specified for the first operation mode and a chip specified for the second operation mode can be integrated so that a single chip can be used in either operation mode.

Preferred embodiments of the present invention will be explained below in detail with reference to the accompanying drawings.

Figure 1:
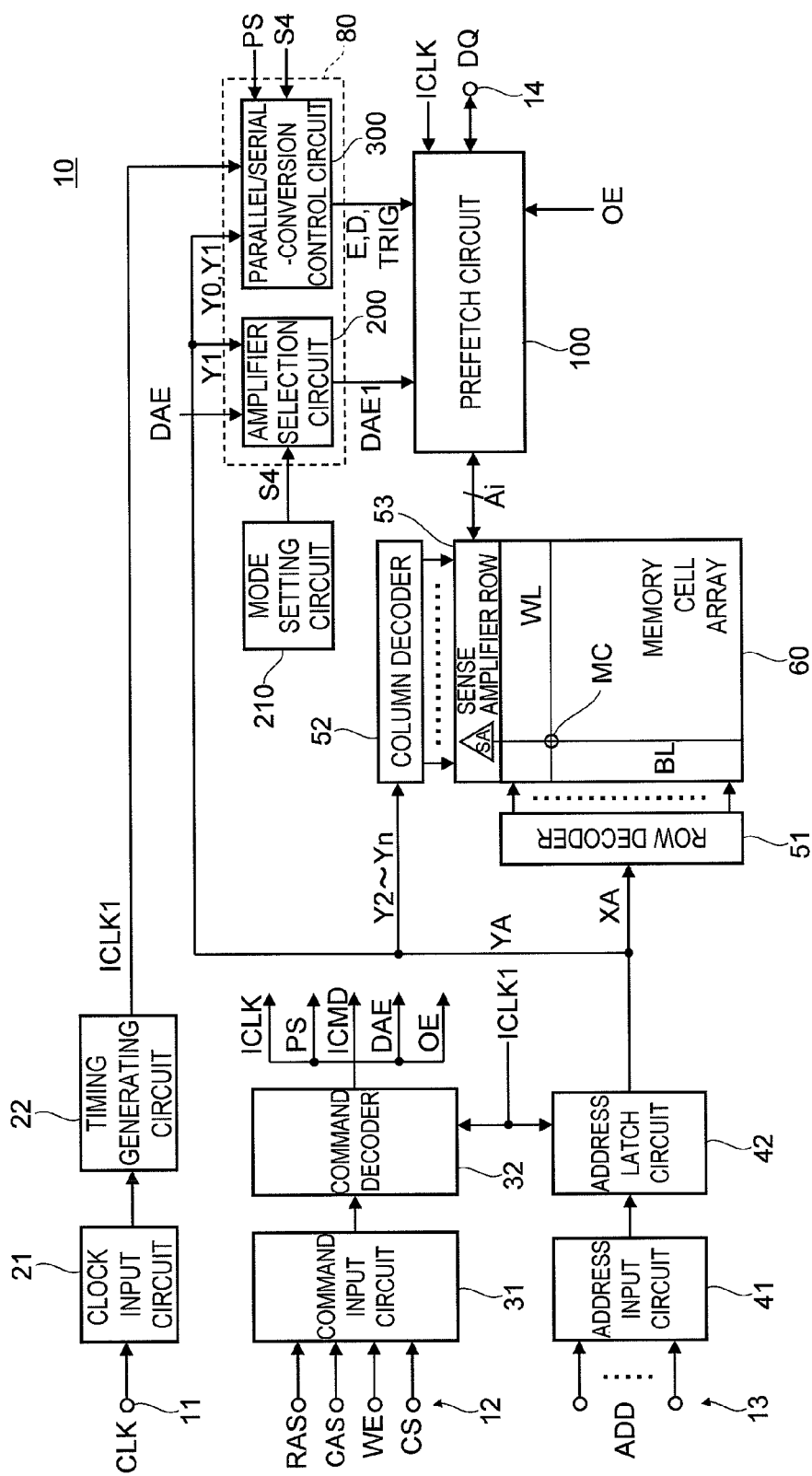
FIG. 1 is a block diagram showing a configuration of a semiconductor memory device 10 according to a preferred embodiment of the present invention.

FIG. 1 is a block diagram showing a configuration of a semiconductor memory device 10 according to a preferred embodiment of the present invention.

The semiconductor memory device 10 according to the present embodiment is a DDR (Double Data Rate) SDRAM, which can be used as either a DDR1 SDRAM or a DDR2 SDRAM. Therefore, the prefetch number is two bits when the semiconductor memory device 10 is used as the DDR1 SDRAM, whereas the prefetch number is four bits when used as the DDR2 SDRAM.

The semiconductor memory device 10 according to the embodiment includes at least a clock terminal 11, a command terminal 12, an address terminal 13, and a data input/output terminal 14 as external terminals.

The clock terminal 11 is supplied with a clock signal CLK, which is a synchronization signal. The supplied clock signal CLK is then supplied to a clock input circuit 21. An output of the clock input circuit 21 is supplied to a timing generating circuit 22. The timing generating circuit 22 functions to generate an internal clock ICLK1 and supply the clock to various internal circuits. In FIG. 1, the internal clock ICLK1 is output to other circuits (not shown), in addition to a parallel/serial-conversion control circuit 300, a command decoder 32, and an address latch circuit 42.

The command terminal 12 is supplied with command signals such as a row-address strobe signal RAS, a column-address strobe signal CAS, a write enable signal WE, and a chip select signal CS. These command signals are supplied to a command input circuit 31. The command signals supplied to the command input circuit 31 are supplied to the command decoder 32. The command decoder generates various internal commands ICMD by holding, decoding, and counting the command signals in synchronization with the internal clock ICLK1. Included in the internal commands ICMD are an amplifier enable signal DAE, a parallel/serial-conversion control signal PS, an output enable signal OE, and ICLK, which are supplied to an amplifier selection circuit 200, a parallel/serial-conversion control circuit 300, and a prefetch circuit 100 described below. Other internal commands ICMD are supplied to various internal circuits (not shown). The amplifier enable signal DAE, the parallel/serial-conversion control signal PS, the output enable signal OE, ICLK, and other internal commands ICMD are each activated after a read command is issued, at predefined different timings considering CAS latency (which shows a count of the synchronization signals CLK from when the command is input to when read data is output to the data input/output terminal).

The address terminal 13 is supplied with an address signal ADD. The supplied address signal ADD is supplied to an address input circuit 41. An output of the address input circuit 41 is supplied to the address latch circuit 42. The address latch circuit 42 latches the address signal ADD in synchronization with the internal clock ICLK. Of the address signal ADD latched by the address latch circuit 42, a row address. XA is supplied to a row decoder 51 and a column address YA is supplied to a column decoder 52, and the like.

The row decoder 51 selects a word line WL from a plurality of word lines included in a memory cell array 60 based on the row address XA. In the memory cell array 60, a plurality of word lines WL intersect with a plurality of bit lines BL, with a memory cell MC placed at each intersection thereof (in FIG. 1, only one word line WL, one bit line BL, and one memory cell MC are shown). The bit lines BL are connected to a corresponding sense amplifier SA in a sense amplifier row 53.

Selection by the sense amplifier SA included in the sense amplifier row 53 is performed by the column decoder 52 based on the column address YA. More specifically, the third lowest bit Y2 to the most significant bit Yn of the column address YA are input to the column decoder 52 and the column decoder 52 selects, based on the input bits, four sense amplifiers SA from the sense amplifiers included in the sense amplifier row 53. That is, a 4-bit data (read data) is read from the memory cell array 60 in a lump. A plurality of output signals Ai (i=1 to 4) corresponding to the 4-bit data of the sense amplifier row 53 are supplied in parallel to the prefetch circuit 100.

The prefetch circuit 100 functions to convert read data supplied in parallel from the sense amplifier row 53 to serial data to output it through a data input/output terminal 14 (DQ), and convert write data serially input to the data input/output terminal 14 to parallel data to supply it to the sense amplifier row 53. The operation of the prefetch circuit 100 is controlled by a control circuit 80.

A mode setting circuit 210 has mode information that is set to determine whether the semiconductor memory device 10 is used as a DDR1 SDRAM (second operation mode) or as a DDR2 SDRAM (first operation mode). The prefetch number is set by a nonvolatile element such as an EEPROM or a fuse, an external terminal specifying a wire bonding option, or a volatile element set by a controller that controls the semiconductor device.

The control circuit 80 includes the amplifier selection circuit 200 and the parallel/serial-conversion control circuit 300. The amplifier selection circuit 200 receives Y1 (first address signal), which is the second lowest bit of the column address YA, and a prefetch number selection signal S4 (mode setting signal), which is the output of the mode setting circuit 210 that sets the prefetch number, and generates, based on these signals, an amplifier selection signal DAE1. The parallel/serial-conversion control circuit 300 generates various control signals E, D, and TRIG in synchronization with the internal clock ICLK1, based on the prefetch number selection signal S4, which is the output of the mode setting circuit 210, the parallel/serial-conversion control signal PS, and the least significant bit Y0 (first selection signal; second address signal) and the second lowest bit Y1 (second selection signal) of the column address YA. Particularly, eight control signals (transfer control signals E00, E01, E10, E11, D00, D01, D10, and D11) are generated from the prefetch number selection signal S4 and the column address Y1 in synchronization with the parallel/serial-conversion control signal PS, respectively for a group of signals included in the control signals E and D. Specifically, for the DDR2 SDRAM (4-bit prefetch operation), only E00, E11, D00, and D11 are generated when the column address (Y1) at the time of a read command (READ) is Low (0), in which case all pipelines P1 to P4 are used. When the column address (Y1) at the time of the read command (READ) is High (1), only E01, E10, D01, and D10 are generated, in which case all the pipelines P1 to P4 are used. For the DDR1 SDRAM (2-bit prefetch operation), only E00, E10, D00, and D10 are generated, in which case only the pipelines P1 and P3 are used.

The general configuration of the semiconductor memory device 10 according to the present embodiment has been described above. In the following descriptions, the configuration of the semiconductor memory device 10 according to the present embodiment will be described more in detail, focusing on the prefetch circuit 100.

Figure 2:
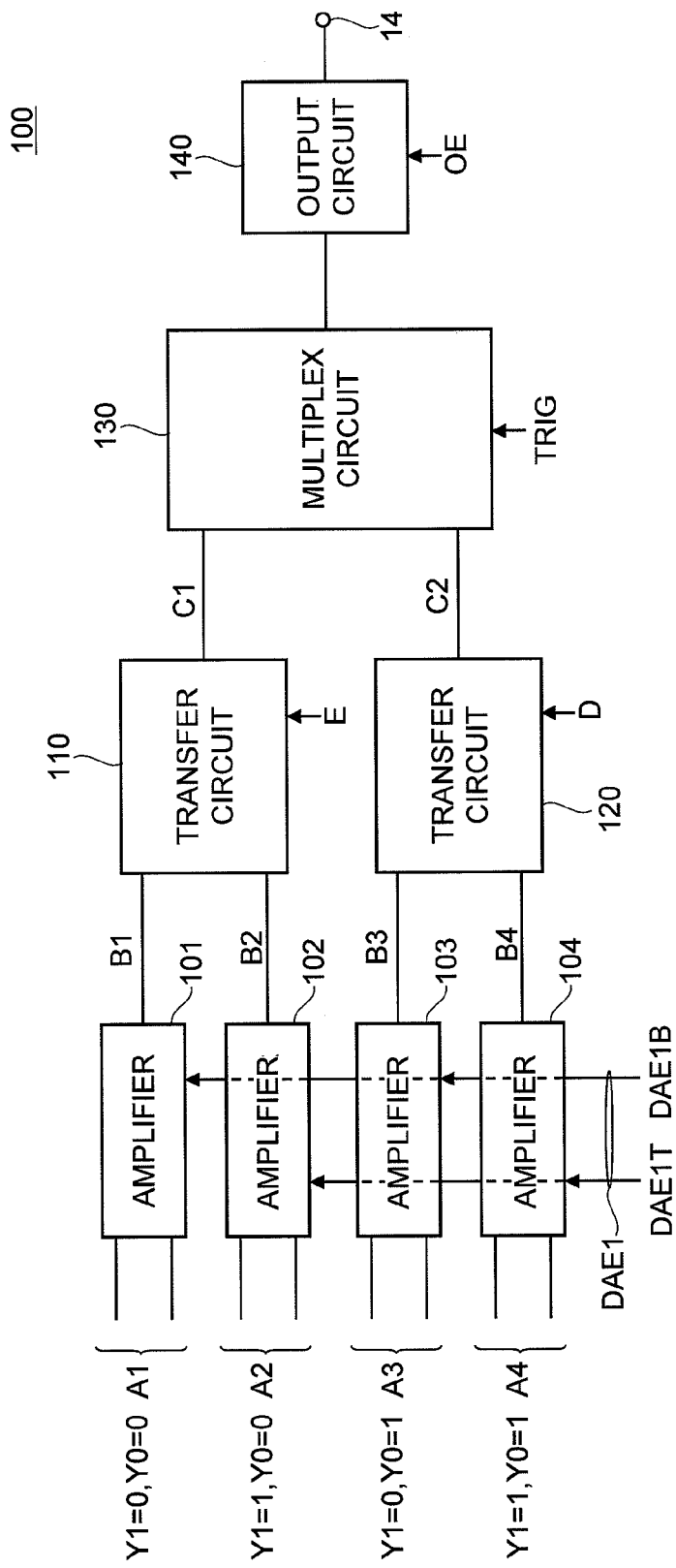
FIG. 2 is a block diagram schematically showing a configuration of a prefetch circuit 100.

FIG. 2 is a block diagram schematically showing the configuration of the prefetch circuit 100.

As shown in FIG. 2, the prefetch circuit 100 includes four amplifiers 101 to 104, two transfer circuits 110 and 120, a multiplex circuit 130, and an output circuit 140.

The amplifiers 101 to 104 amplify read data supplied via complementary data bus pairs A1 to A4, and output it to single-end data buses B1 to B4, respectively. The operations of the amplifiers 101 to 104 are controlled by amplifier selection signals DAE1T (sixth control signal) and DAE1B (fifth control signal), which are outputs of the amplifier selection circuit 200. More specifically, the amplifiers 101 and 103 are controlled by the amplifier selection signal DAE1B, whereas the amplifiers 102 and 104 are controlled by the amplifier selection signal DAE1T. The amplifier selection signals DAE1T and DAE1B correspond to the amplifier selection signal DAE1 shown in FIG. 1. The amplifiers 101 to 104 each have a function of latching amplified read data.

Figure 3:
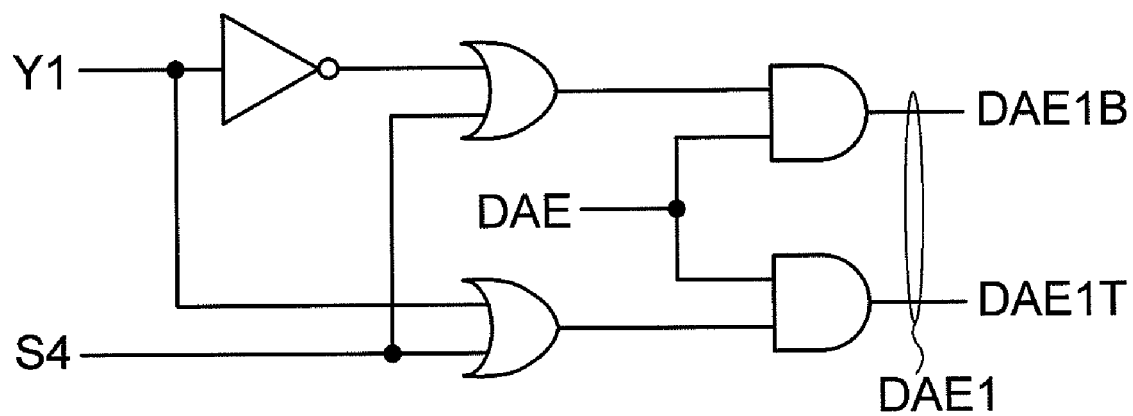
FIG. 3 is a circuit diagram of an amplifier selection circuit 200.

FIG. 3 is a circuit diagram of the amplifier selection circuit 200.

As shown in FIG. 3, the amplifier selection circuit 200 includes a logic gate circuit that receives the amplifier enable signal DAE, the second lowest bit Y1 of the column address, and the prefetch number selection signal S4, and generates the amplifier selection signals DAE1B and DAE1T. The amplifier enable signal DAE, supplied from the command decoder 32, is activated at a predefined timing, after the read command has been issued, considering the CAS latency. The prefetch number selection signal S4, supplied from the mode setting circuit 210, is fixed to a low level when the semiconductor memory device 10 is used as the DDR1 SDRAM and fixed to a high level when the semiconductor memory device 10 is used as the DDR2 SDRAM.

According to the above configuration, when the DDR1 SDRAM (2-bit prefetch operation; second operation mode) is selected (S4=L) and when the amplifier enable signal DAE is activated, one of the amplifier selection signals DAE1B and DAE1T is activated based on the second lowest bit Y1 of the column address. That is, the amplifiers 101 and 103, or the amplifiers 102 and 104 are activated simultaneously, among the amplifiers 101 to 104. In contrast, when the DDR2 SDRAM (4-bit prefetch operation; first operation mode) is selected (S4=H) and when the amplifier enable signal DAE is activated, both the amplifier selection signals DAE1B and DAE1T are activated regardless of the second lowest bit Y1 of the column address. That is, the amplifiers 101 to 104 are activated simultaneously.

Returning to FIG. 2, the data bus pairs A1 to A4 input to the amplifiers 101 to 104 are wirings supplied with the 4-bit read data that has been read from the sense amplifier row 53, respectively. More specifically, read data (first data) assigned to column addresses Y1=0 and Y0=0 is read from the data bus pair A1, read data (second data) assigned to column addresses Y1=1 and Y0=0 is read from the data bus pair A2, read data (third data) assigned to column addresses Y1=0 and Y0=1 is read from the data bus pair A3, and read data (fourth data) assigned to column addresses Y1=1 and Y0=1 is read from the data bus pair A4. The 4-bit read data that is simultaneously read via the data bus pairs A1 to A4 is defined by the remaining bits Y2 to Yn of the column address as described above.

The transfer circuit 110 converts the read data supplied via data buses B1 (first node) and B2 (second node) into serial data, and the read data converted into the serial data is output to a data bus C1 (third node). Similarly, the transfer circuit 120 converts the read data supplied via data buses B3 and B4 into serial data, and the read data converted into the serial data is output to a data bus C2. The transfer circuits 110 and 120 operate based on the transfer control signals E and D, respectively. The transfer control signals E and D are both groups of signals including a plurality of transfer control signals. Specifically, as shown in FIG. 4 described below, the transfer control signal E is a group of signals including seven transfer control signals E00, E10, E01, E11, E1a, E2a, and E2b, whereas the transfer control signal D is a group of signals including seven transfer control signals D00, D10, D01, D11, D1a, D2a, and D2b.

The multiplex circuit 130 converts the read data supplied via the data buses C1 and C2 into serial data, and the read data converted into the serial data is supplied to the output circuit 140. The operation of the multiplex circuit 130 is controlled by a trigger signal TRIG (seventh control signal). The output circuit 140 outputs the read data supplied from the multiplex circuit 130 to the data input/output terminal 14 in synchronization with the output enable signal OE.

According to the above configuration, the prefetch circuit 100 can convert the 4-bit read data supplied in parallel via the data bus pairs A1 to A4 into serial data, and burst-output the data serially through the data input/output terminal 14. The foregoing is the operation performed when reading data, and an operation opposite to the reading (serial-to-parallel conversion) is performed using a circuit block (not shown) included in the prefetch circuit 100 when writing data. In the present embodiment, descriptions of the circuit block used in the write operation are omitted.

Figure 4:
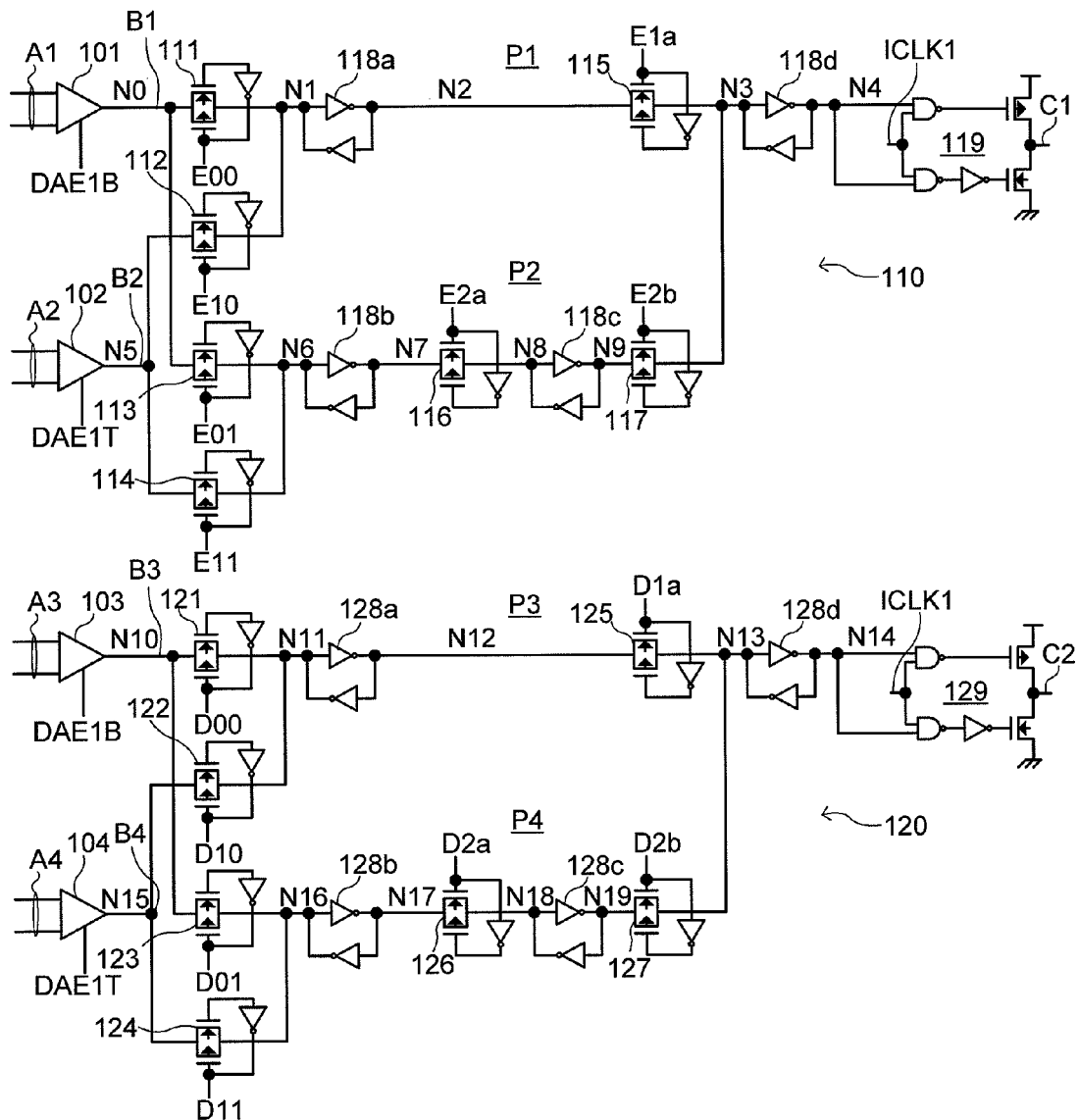
FIG. 4 is a circuit diagram of amplifiers 101 to 104 and transfer circuits 110 and 120.

FIG. 4 is a circuit diagram of the amplifiers 101 to 104 and the transfer circuits 110 and 120.

As shown in FIG. 4, the amplifiers 101 and 103 of the amplifiers 101 to 104 are activated by the amplifier selection signal DAE1B, whereas the amplifiers 102 and 104 are activated by the amplifier selection signal DAE1T. This is just as described with reference to FIG. 2. Outputs of the amplifiers 101 and 102 are supplied to the transfer circuit 110 via the data buses B1 and B2. Outputs of the amplifiers 103 and 104 are supplied to the transfer circuit 120 via the data buses B3 and B4. The amplifiers 101 to 104 have a function of latching the amplified read data (not shown), respectively.

The transfer circuit 110 has two pipeline circuits P1 and P2 (first and second pipelines).

The pipeline circuit P1 includes transfer gates (switches) 111, 112, and 115 each composed of a CMOS and a latch circuit 118a (delay circuit). Nodes N0 and N5, which are input ends of the transfer gates 111 and 112, are connected to the data buses B1 and B2, and are supplied with outputs of the amplifiers 101 and 102, respectively. The transfer gates 111 and 112 are respectively controlled by transfer control signals E00 (first control signal) and E10 (second control signal), which are activated exclusively. Output ends of the transfer gates 111 and 112 are both connected to a node N1 in the pipeline circuit P1. Therefore, the pipeline circuit P1 is supplied with one of the outputs of the amplifiers 101 and 102.

The read data supplied to the node N1 is latched by the latch circuit 118a and output to a node N2. The read data output to the node N2 is supplied to a node N3, which is a common output end of the pipeline circuits P1 and P2, via the transfer gate 115. The transfer gate 115 is controlled by the transfer control signal E1a.

The pipeline circuit P2 includes transfer gates 113, 114, 116, and 117, and latch circuits 118b and 118c. The nodes N5 and N0, which are input ends of the transfer gates 113 and 114 are respectively connected to the data buses B2 and B1 described above. The transfer gates 113 and 114 are respectively controlled by transfer control signals E01 (third control signal) and E11 (fourth control signal) activated exclusively. Output ends of the transfer gates 113 and 114 are both connected to a node N6 in the pipeline circuit P2. Therefore, the pipeline circuit P2 is supplied with the other of the outputs of the amplifiers 101 and 102.

The read data supplied to the node N6 is latched by the latch circuit 118b and output to a node N7. The read data output to the node N7 is supplied to a node N8 via the transfer gate 116. The transfer gate 116 is controlled by the transfer control signal E2a.

The read data supplied to the node N8 is latched by the latch circuit 118c and output to a node N9. The read data output to the node N9 is supplied to the node N3, which is the common output end of the pipeline circuits P1 and P2, via the transfer gate 117. The transfer gate 117 is controlled by the transfer control signal E2b.

The read data output to the node N3, which is the common output end of the pipeline circuits P1 and P2, is latched by the latch circuit 118d and output to a node N4. The read data output to the node N4 is supplied to a clocked buffer 119 that outputs the read data in synchronization with the internal clock signal ICLK. An output end of the clocked buffer 119 is connected to the data bus C1, thereby driving the data bus C1.

Similarly, the transfer circuit 120 has two pipeline circuits P3 and P4. The circuit configuration is identical to that of the transfer circuit 110 (pipeline circuits P1 and P2) as shown in FIG. 4. That is, the pipeline circuit P3 includes transfer gates 121, 112, and 125, and a latch circuit 128a, whereas the pipeline circuit P4 includes transfer gates 123, 124, 126, and 127, and latch circuits 128b and 128c. Read data output to a node N13, which is a common output end of the pipeline circuits P3 and P4, is latched by the latch circuit 128d and output to a node N14. The read data output to the node N14 is supplied to a clocked buffer 129 that outputs the read data in synchronization with the internal clock signal ICLK, thereby driving the data bus C2.

In the transfer circuit 120, the transfer gates 121 to 124 are respectively controlled by transfer control signals D00, D10, D01, and D11, whereas the transfer gates 125 to 127 are respectively controlled by transfer control signals D1a, D2a, and D2b.

Figure 5:
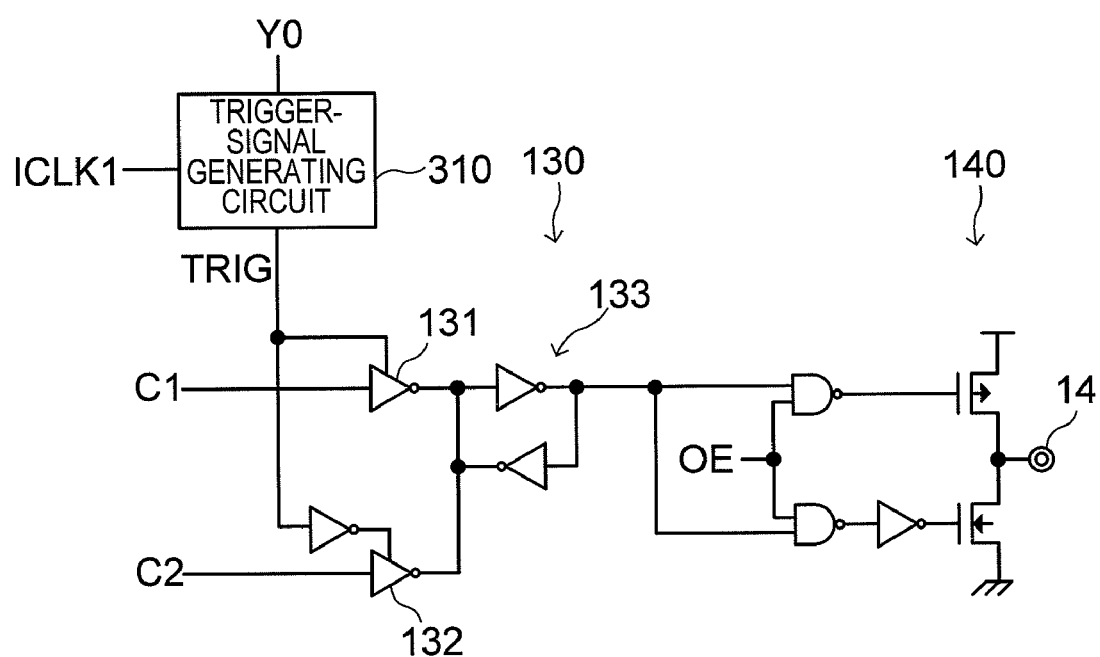
FIG. 5 is a circuit diagram of a multiplex circuit 130 and an output circuit 140.

FIG. 5 is a circuit diagram of the multiplex circuit 130 and the output circuit 140.

As shown in FIG. 5, the multiplex circuit 130 includes a tri-state inverter 131 connected to the data bus C1, a tri-state inverter 132 connected to the data bus C2, and a latch circuit 133 that latches outputs of the tri-state inverters 131 and 132. The tri-state inverters 131 and 132 have input thereto the multiplex trigger signal TRIG, whereby one of the tri-state inverters 131 and 132 turns into an enabled state and the other into a high-impedance state, alternately.

The multiplex trigger signal TRIG is generated by a trigger-signal generating circuit 310 included in the parallel/serial-conversion control circuit 300. The trigger-signal generating circuit 310 receives the least significant bit Y0 of the column address and generates, based on the logic level thereof, the multiplex trigger signal TRIG synchronized with the internal clock signal ICLK. This causes the read data supplied in parallel from the data buses C1 and C2 to be supplied from the multiplex circuit 130 to the output circuit 140 in the order specified by the least significant bit Y0 of the column address.

The output circuit 140 includes a tri-state buffer that outputs the read data which is output from the multiplex circuit 130 to the data input/output terminal 14. The tri-state buffer included in the output circuit 140 is supplied with the output enable signal OE, whereby the read data supplied from the multiplex circuit 130 is output from the data input/output terminal 14 when the output enable signal OE is activated.

The following is provided in addition to the descriptions of the aforementioned circuit configuration. The logic (0 and 1) of the column address Y1 when the read command (READ) is issued defines the order of outputting, to the data bus C1 which is the output of the data transfer circuit, of the data of the amplifiers 101 and 102 to be input to the transfer circuit 110. The order is controlled by the transfer control signals E00, E01, E10, and E11 (first to fourth control signals) that control the transfer gates 111 to 114 (first to fourth switches). The same goes for the transfer circuit 120. The logic of the column address Y0 when the read command (READ) is issued defines the order of outputting, to the output circuit 140 which is the output of the multiplex circuit, of the data of the data buses C1 and C2 to be input to the multiplex circuit. The order is controlled by the output signal of the trigger-signal generating circuit 310 that controls the tri-state inverters 131 and 132.

The circuit configuration of the semiconductor memory device 10 according to the present embodiment has thus been described. An operation of the semiconductor memory device 10 according to the present embodiment will be described next.

Figure 6:
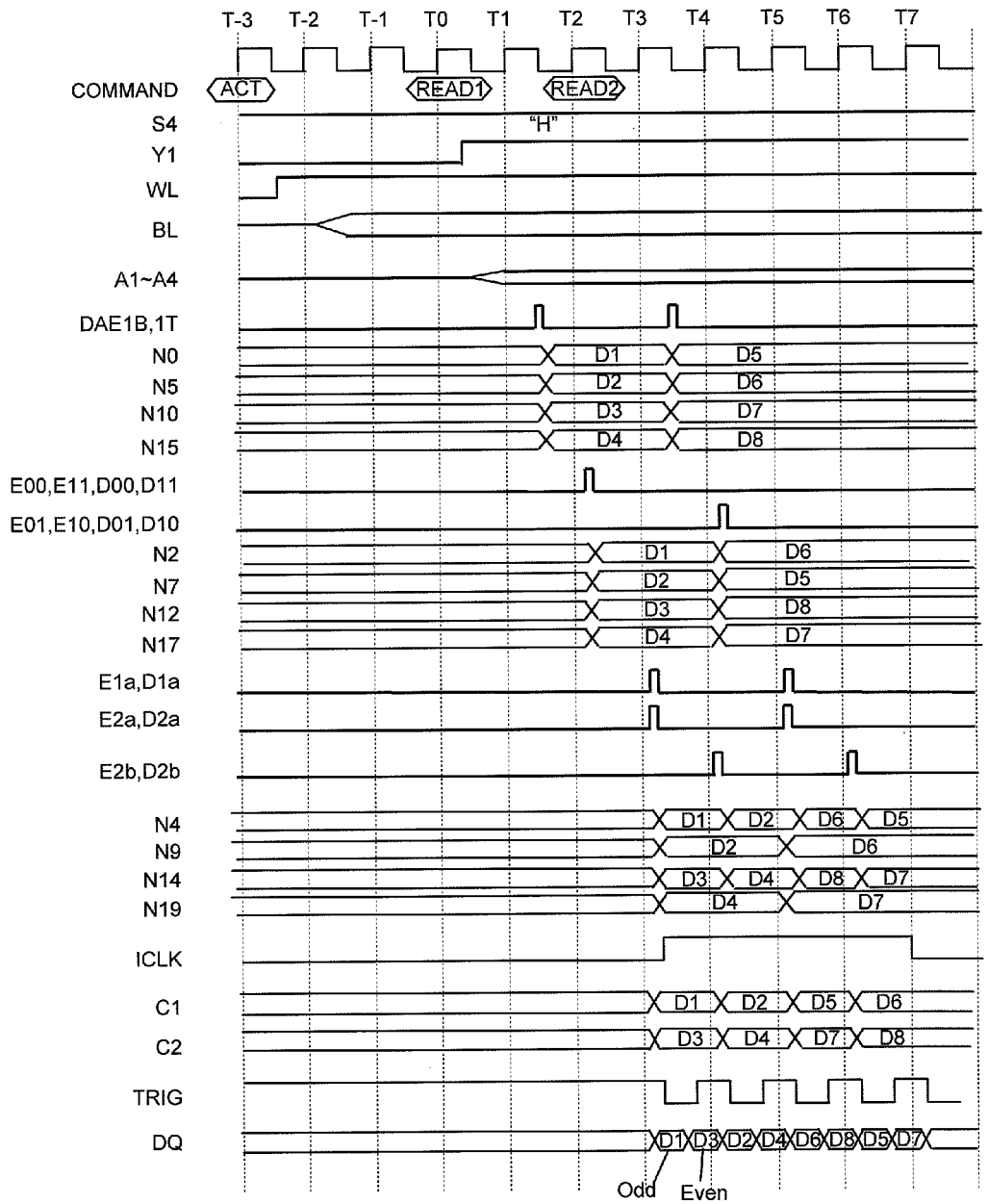
FIG. 6 is a timing chart for explaining a read operation when the semiconductor memory device 10 is used as a DDR2 SDRAM.

FIG. 6 is a timing chart for explaining a read operation when the semiconductor memory device 10 is used as the DDR2 SDRAM (4-bit prefetch operation).

In the example shown in FIG. 6, an active command (ACT) and a row address (XA) (not shown) are input in synchronization with an active edge T-3 of the clock signal CLK, in response to which the corresponding word line WL is activated. Accordingly, a difference in electric potentials arises in a pair of bit lines BL corresponding to one of the plural memory cells MC. The difference in electric potentials is amplified by the sense amplifier row 53. Sense amplifiers included in the sense amplifier row 53 corresponding to the memory cells MC connected to the selected word line WL amplify information of the memory cells, respectively.

Subsequently, a first read command (READ) and a column address (YA) are input in synchronization with an active edge T0 of the clock signal CLK. The signal Y1 of the column address (YA) is illustrated. The signal Y1 is Low (0) at the active edge T0 of the clock signal CLK. Accordingly, four sense amplifiers SA in the sense amplifier row 53 are selected, and the read data, which are outputs thereof, are transmitted to the corresponding data bus pairs A1 to A4. Depending on the logic of the signal Y1, as will be described below, so-called burst-outputting that outputs two sets of read data (D1 and D2 (or D3 and D4)) of the two sense amplifiers SA (101 and 102 (or 103 and 104)) to the data bus C1 (or C2) is performed in such an order that the first data bit is at an odd-numbered position (D1 (or D3)). When the signal Y1 is High (1) at the active edge T0 of the clock signal CLK, the first data bit is at an even-numbered position (D2 (or D4)). In this example, the four sets of read data are named starting from D1, and not from D0. Naming the data as D0 to D3 reverses the odd numbers and the even numbers, i.e., it is simply a matter of notation.

Furthermore, the signal Y0 (not shown) of the column address (YA) is Low (0) at the active edge T0 of the clock signal CLK. Depending on the logic of the signal Y0, as will be described below, outputting or so-called burst-outputting to the data input/output terminal (DQ) 14 by the two data buses C1 and C2 via the multiplex circuit 130 is performed in such an order that the first data bit is D1 at an odd-numbered position. When the signal Y0 is High (1) at the active edge T0 of the clock signal CLK, the first data bit is D3 at an odd-numbered position.

After the read data appear in the data bus pairs A1 to A4, the amplifier enable signal DAE is activated (T1). Because the DDR2 SDRAM is selected in this example, the prefetch number selection signal S4 is fixed to a high level. Therefore, the amplifier selection signals DAE1T and DAE1B are simultaneously activated regardless of the logic level of the second lowest bit Y1 of the column address, when the amplifier enable signal DAE is activated. This causes the data buses B1 to B4 (nodes N0, N5, N10, and N15) to be simultaneously supplied with the read data D1 to D4 corresponding thereto.

Subsequently, either the transfer control signals E00, E11, D00, and D11, or the transfer control signals E01, E10, D01, and D10 are simultaneously activated (T2) based on the logic level of the second lowest bit Y1 of the column address when the read command (READ) is issued. In FIG. 6, the example is shown where the transfer control signals E00, E11, D00, and D11 are simultaneously activated. The transfer control signals E01, E10, D01, and D10 are kept inactive. The read data D1 to D4 on the data buses B1 to B4 are thereby input in parallel to the nodes N2, N7, N12, and N17 in the pipeline circuits P1 to P4, respectively.

Subsequently, the transfer control signals E1a, E2a, D1a, and D2a are simultaneously activated (T3). The read data D1 to D4 thereby proceed through the pipeline circuits P1 to P4 toward the output direction of the transfer circuit by one step. This causes the read data D1 and D3 to be respectively output from the pipeline circuits P1 and P3 having a smaller number of steps to the data buses C1 and C2, which are the output of the transfer circuit. That is, the read data D1 and D3 appear at the nodes N4 and N14, respectively. On the other hand, the read data D2 and D4 appear at the nodes N9 and N19 in the pipeline circuits P2 and P4.

Subsequently, the transfer control signals E2b and D2b are simultaneously activated (T4). The read data D2 and D4 thereby proceed through the pipeline circuits P2 and P4 toward the output direction of the transfer circuit further by one step. This causes the read data D2 and D4 to be respectively output from the pipeline circuits P2 and P4 having a larger number of steps to the data buses C1 and C2, which are the output of the transfer circuit.

The read data D1 to D4, which are sequentially output from the pipeline circuits P1 to P4 in this manner, are output (supplied), in synchronization with the control signals E and D, and the internal clock signal ICLK, to the data buses C1 and C2, which are the output of the transfer circuit. That is, the read data are thus output to the data bus C1 in the order of D1 and D2, whereas the read data are output to the data bus C2 in the order of D3 and D4. The signal ICLK shown in FIG. 6 is illustrated as a waveform that is continuously kept High during output of the so-called burst data (D1 to D8).

Subsequently, in synchronization with the multiplex trigger signal TRIG, the multiplex circuit 130 converts, the read data D1 and D3 that have been input in parallel into serial data (T3), and further converts the read data D2 and D4 that have been input in parallel into serial data (T4). The order of outputting the data is defined by the least significant bit Y0 of the column address. In the example shown in FIG. 6, the read data are output to the output circuit 140 in the order of D1, D3, D2, and D4, which are output to the outside (the data input/output terminal 14) in synchronization with the output enable signal OE.

In the example shown in FIG. 6, the subsequent second read command (READ) and the column address (YA) are input in synchronization with an active edge T2 of the clock signal CLK. The signal Y1 of the column address (YA) is illustrated. The signal Y1 is High (1) at the active edge T2 of the clock signal CLK. The signal Y0 (not shown) is Low (0) at the active edge T2 of the clock signal CLK. Similarly with the explanation of the control from T1 (control of DAE1) to T4 (TRIG) corresponding to the first read command (READ), the read data are output in the order of D6, D8, D5, and D7 in a period from T3 to T6. This is because the transfer gates 112 and 113 become conductive whereas the transfer gates 111 and 114 become nonconductive due to the High (1) level of Y1, and also because the transfer gates 122 and 123 become conductive whereas the transfer gates 121 and 124 become nonconductive.

As described above, when the DDR2 SDRAM is selected, the 4-bit read data simultaneously read from the memory cell array 60 is serially output in the order based on the column addresses Y0 and Y1.

Figure 7:
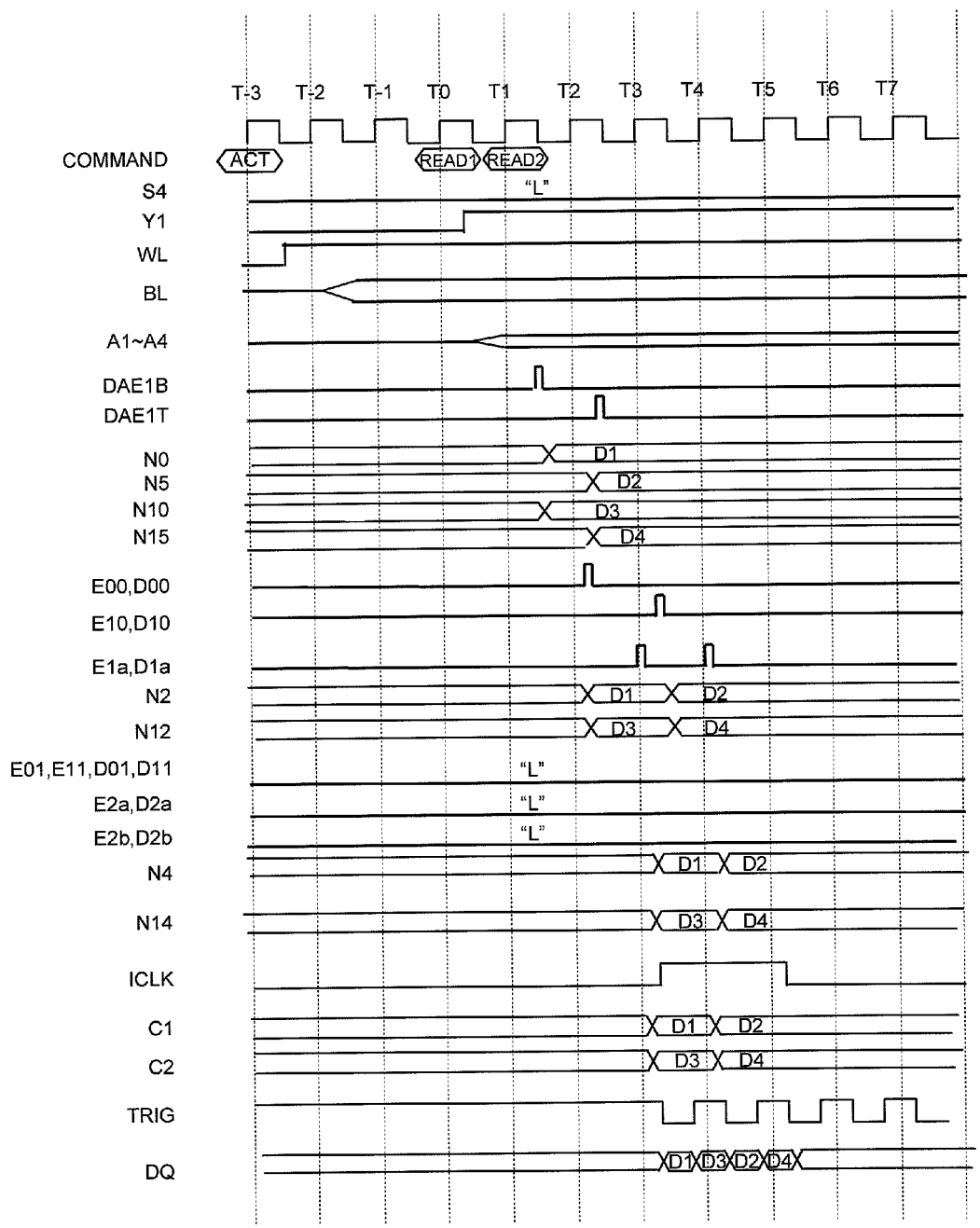
FIG. 7 is a timing chart for explaining a read operation when the semiconductor memory device 10 is used as a DDR1 SDRAM.

FIG. 7 is a timing chart for explaining a read operation when the semiconductor memory device 10 is used as the DDR1 SDRAM (2-bit prefetch operation).

Also in the example shown in FIG. 7, the activation command (ACT) and the row address (XA) (not shown) are input in synchronization with the active edge T-3 of the clock signal CLK, and further, the first read command (READ) and the column address (YA) are input in synchronization with the active edge T0 of the clock signal CLK. The column address Y1 is Low (0), and the column address Y0 (not shown) is Low (0). Four sense amplifiers SA in the sense amplifier row 53 are thereby selected, and the read data output therefrom are transmitted to the data bus pairs A1 to A4, respectively.

After the read data appear in the data bus pairs A1 to A4, the amplifier enable signal DAE is activated (T1). Because the DDR1 SDRAM is selected in this example, the prefetch number selection signal S4 is fixed to a low level. Therefore, one of the amplifier selection signals DAE1T and DAE1B is activated based on the logic level of the second lowest bit Y1 of the column address, when the amplifier enable signal DAE is activated. In the example shown in FIG. 7, the amplifier selection signal DAE1B is activated. This causes the data buses B1 and B3 (nodes N0 and N10) to be simultaneously supplied with the corresponding read data D1 and D3, respectively. The data buses B2 and B4 (nodes N5 and N15) are not supplied with the read data that are effective data corresponding to the four sense amplifiers SA. When the column address Y1 is High (1), the amplifier selection signal DAE1T is activated at T1.

Either the transfer control signals E00 and D00, or the transfer control signals E10 and D10 are then simultaneously activated based on the logic level of the second lowest bit Y1 of the column address (T2). In FIG. 7, an example is shown where the transfer control signals E00 and D00 are simultaneously activated. The transfer control signals E10 and D10 are kept inactive at T2. The read data D1 and D3 on the data buses B1 and B3 are thereby input in parallel to the pipeline circuits P1 and P3, respectively. That is, the pipeline circuits P2 and P4 are not used in the data processing corresponding to the first read command (READ). When the column address Y1 is High (1), the transfer control signals E10 and D10 are simultaneously activated at T2. The transfer control signals E00 and D00 are kept inactive at T2.

The transfer control signals E1a and D1a are then simultaneously activated (T3). This causes the read data D1 and D3 to be output from the pipeline circuits P1 and P3 to the data buses C1 and C2, which are the outputs of the transfer circuit, respectively. In this manner, the read data D1 and D3 are output (supplied), in synchronization with the control signals E and D and the internal clock signal ICLK, to the data buses C1 and C2. The signal ICLK shown in FIG. 7 is illustrated as a waveform that is continuously kept High during the output period for the so-called burst data (D1 to D4).

The multiplex circuit 130 then converts, in synchronization with the multiplex trigger signal TRIG, the read data D1 and D3 that have been input in parallel into serial data (T3). The order of outputting the data is defined by the least significant bit Y0 of the column address. In the example shown in FIG. 7, the read data are output to the output circuit 140 in the order of D1 and D3, which are output to the outside in synchronization with the output enable signal OE.

Additionally, in the example shown in FIG. 7, the subsequent second read command (READ) and the column address (YA) are input in synchronization with the active edge T1 of the clock signal CLK. Similarly with the explanation of the controls of T1 (control of DAE1) to T3 (TRIG) corresponding to the first read command (READ), the read data are output in the order of D2 and D4 in the period from T2 to T4. That is, the pipeline circuits P2 and P4 are not used in the data processing corresponding to the first read command (READ).

It should be noted that, while the first and second read commands of the DDR2 SDRAM (4-bit prefetch operation) disclosed in FIG. 6 require two clocks (the clock signal CLK), the first and second read commands of the DDR1 SDRAM (2-bit prefetch operation) disclosed in FIG. 7 require one clock (the clock signal CLK). Because the pipelines P2 and P4 are not used in the DDR1 SDRAM (2-bit prefetch operation) due to the configurations of the transfer circuits 110 and 120 and the control thereof according to the present application, the first and second read commands can be input in a single clock.

As described above, when the DDR1 SDRAM is selected, two bits are selected among the 4-bit read data simultaneously read from the memory cell array 60, based on the second lowest bit Y1 of the column address, the selected two bits are then serially output in the order defined based on the least significant bit Y0 of the column address. The pipeline circuits P2 and P4 are not used in the data processing corresponding to the first and second read commands (READ).

According to the present embodiment, as described above, because the operations of the pipeline circuits P1 to P4 included in the transfer circuits 110 and 120 are switched depending on whether the DDR1 SDRAM (2-bit prefetch operation) or the DDR2 SDRAM (4-bit prefetch operation) is selected, specifications of the DDR1 SDRAM and the DDR2 SDRAM can be integrated into a single chip, while minimizing the complexity of the circuit configuration. This is mainly due to the configurations (connection relations) and the selective control of the transfer gates 111 to 114 and 121 to 124. In the DDR2 SDRAM (4-bit prefetch operation), all the pipelines P1 to P4 are used by either "using only the transfer gates 111, 114, 121, and 124", or "using only the transfer gates 112, 113, 122, and 123". In the DDR1 SDRAM (2-bit prefetch operation), only the transfer gates 111 to 112 and 121 to 122 are used, and accordingly only the pipelines P1 and P3 are used.

It is apparent that the present invention is not limited to the above embodiments, but may be modified and changed without departing from the scope and spirit of the invention.

Although the 2-bit prefetch and the 4-bit prefetch have been exemplified in the above embodiment, the invention is not limited thereto and can be applied to a 1-bit prefetch and a 2-bit prefetch. Furthermore, in addition to the first and second transfer circuits, third and fourth transfer circuits can be input to the multiplexer in parallel to increase the prefetch number. The prefetch number can also be increased by using a first multiplexer corresponding to the first and second transfer circuits, a second multiplexer corresponding to the third and fourth transfer circuits, and a third multiplexer that further multiplexes the outputs of the first and second multiplexers and outputs multiplexed outputs.

Although the example of integrating the specifications of the DDR1 SDRAM and the DDR2 SDRAM into a single chip has been described in the above embodiment, the invention, not being limited thereto, can be applied to other semiconductor devices having integrated into a single chip a plurality of specifications for serially outputting parallel internal signals to the outside.

Although the DRAM has been exemplified in the above embodiment, the basic technical idea of the present application is not limited thereto and other synchronous memories including SRAMs or nonvolatile memories can be used. Further, the prefetch numbers are not limited to two and four. This can be easily understood by those skilled in the art from the basic technical idea of the present application.

Furthermore, although the semiconductor memory device has been exemplified in the embodiment, it is needless to say that the basic technical idea of the present application is not limited to the semiconductor memory device and can be generally applied to semiconductor devices having a memory function installed therein. That is, it can be applied to a semiconductor device having a logic function including a storage cell, or a semiconductor device having installed therein memory cells such as SOC (system on chip), MCP (multi-chip package), or POP (package on package). Any configurations of an amplifier for data amplification and a transfer gate (switch) for a latch circuit and a latency control can be used.

Further, it is needless to say that the invention is useful for a logic device or a MCU having memory cells coexisting thereon, and is useful for general semiconductor systems, without being limited to a memory system.

In addition, it suffices that the transistor is a Field Effect Transistor (FET), and the present invention can be applied to various types of FETs such as a MIS (Metal-Insulator Semiconductor) transistor, other than an MOS (Metal Oxide Semiconductor). A bipolar transistor can also be used. An NMOS transistor (N-channel MOS transistor) is a typical first-conductive transistor, and a PMOS transistor (P-channel MOS transistor) is a typical second-conductive transistor.

Many combinations or selections of the various disclosed elements can be made without departing from the scope of the invention. That is, the invention of course includes various modifications and changes that can be made by those skilled in the art based on the entire disclosure including the appended claims and technical concepts of the invention.

What is claimed is:

1. A semiconductor device having a first transfer circuit, the first transfer circuit comprising:
   first to third nodes;
   a first pipeline circuit including an input node, an output node and a predefined number of delay circuits respectively controlled by a synchronization signal;
   a second pipeline circuit including an input node, an output node and a larger number of delay circuits than the number of the delay circuits in the first pipeline circuit; and
   first to fourth switches controlled based on first to fourth control signals, respectively, wherein
   the first and second nodes receive first and second data, respectively in parallel,
   the first switch is connected between the first node and the input node of the first pipeline circuit,
   the second switch is connected between the second node and the input node of the first pipeline circuit,
   the third switch is connected between the first node and the input node of the second pipeline circuit,
   the fourth switch is connected between the second node and the input node of the second pipeline circuit,
   each of the output terminals of the first and second pipeline circuits is connected to the third node,
   in a first operation mode, either the first and fourth control signals or the second and third control signals are activated by a first address signal, whereby the first and second data are sequentially output to the third node as serial data via the first and second pipeline circuits corresponding thereto, respectively and
   in a second operation mode, one of the first and second control signals is activated by the first address signal and the third and fourth control signals are fixed to an inactive state, whereby one of the first and second data is output to the third node via the first pipeline circuit.

2. The semiconductor device as claimed in claim 1, wherein
   the first and fourth control signals, or the second and third control signals are simultaneously activated at a same time according to the synchronization signal in the first operation mode, and
   one of the first and second control signals is activated according to the synchronization signal in the second operation mode.

3. The semiconductor device as claimed in claim 1, wherein the synchronization signal supplied to the second pipeline is inactivated in the second operation mode.

4. The semiconductor device as claimed in claim 1, further comprising first and second amplifiers that are controlled by fifth and sixth control signals, and generate the first and second data, respectively, wherein
   one of the fifth and the sixth control signals is activated according to the selected one of the first and second control signals in the second operation mode.

5. The semiconductor device as claimed in claim 1, wherein the first to fourth control signals are generated based on the first address signal of one bit for selecting the first and second data and a mode setting signal of one bit for selecting one of the first and second operation modes.

6. The semiconductor device as claimed in claim 5, wherein the mode setting signal changes combination of the first to fourth control signals selected by the first address signal in the first and second operation modes.

7. The semiconductor device as claimed in claim 6, wherein the node setting signal brings the third and fourth control signals into the inactive state in the second operation mode.

8. The semiconductor device as claimed in claim 1, further having a second transfer circuit having a same circuit configuration as the first transfer circuit, and a multiplexer, wherein
   first and second nodes of the second transfer circuit receive third and fourth data, respectively in parallel,
   in the first operation mode, the third and the fourth data are sequentially output to the third node as serial data via first and second pipeline circuits of the second transfer circuit, respectively,
   in the second operation mode, one of the third and fourth data is output to a third node of the second transfer circuit via the first pipeline circuit of the second transfer circuit,
   the third node of each of the first and second transfer circuits is connected to a plurality of input terminals of the multiplexer, and
   the multiplexer alternately outputs data from the third node of each of the first and second transfer circuits by a seventh control signal.

9. The semiconductor device as claimed in claim 8, wherein
   the first to fourth control signals are generated based on the first address signal of one bit for selecting the first and second data and the mode setting signal of one bit for selecting one of the first and second operation modes, and
   the seventh control signal is generated based on a second address signal of one bit for selecting either the first and third data or the second and fourth data.

10. A semiconductor device comprising:
   first to fourth amplifiers that output first to fourth output signals in parallel, respectively;
   a first transfer circuit including a first output node, a first pipeline circuit that transfers one of the first and second output signals to the first output node at a first timing, and a second pipeline circuit that transfers the other of the first and second output signals to the first output node at a second timing which is different from the first timing;
   a second transfer circuit including a second output node, a third pipeline circuit that transfers one of the third and fourth output signals to the second output node at a third timing, and a fourth pipeline circuit that transfers the other of the third and fourth output signals to the second output node at a fourth timing which is different from the third timing;
   a multiplex circuit that converts signals output in parallel from the first and second output nodes into a serial signal; and
   a control circuit that controls operations of at least the first and second transfer circuits, wherein,
   the control circuit in a first operation mode causes the first to fourth output signals to be serially output from the multiplex circuit by operating the first to fourth pipeline circuits in parallel, and
   the control circuit in a second operation mode causes one of the first and second output signals and one of the third and fourth output signals to be serially output from the multiplex circuit by operating the first and third pipeline circuits in parallel and stopping the operations of the second and fourth pipeline circuits.

11. The semiconductor device as claimed in claim 10, wherein the second timing is later than the first timing, and the fourth timing is later than the third timing.

12. The semiconductor device as claimed in claim 10, wherein the first timing and the third timing are simultaneous, and the second timing and the fourth timing are simultaneous.

13. The semiconductor device as claimed in claim 10, wherein
the control circuit in the first operation mode operates the first to fourth amplifiers in parallel, and
the control circuit in the second operation mode operates one of the first and second amplifiers, and one of the third and fourth amplifiers in parallel.

14. The semiconductor device as claimed in claim 10, wherein
the first and second output signals, and the third and fourth output signals are distinguished by a logic level of a first selection signal, and
the first and third output signals, and the second and fourth output signals are distinguished by a logic level of a second selection signal.

15. The semiconductor device as claimed in claim 14, wherein the multiplex circuit selects, based on the logic level of the first selection signal, an order of outputting the output signals that are output in parallel from the first and second output nodes.

16. The semiconductor device as claimed in claim 14, wherein
the first transfer circuit selects, based on the logic level of the second selection signal, which of the first and second pipeline circuits is to be supplied with the first and second output signals, and
the second transfer circuit selects, based on the logic level of the second selection signal, which of the third and fourth pipeline circuits is to be supplied with the third and fourth output signals.

17. The semiconductor device as claimed in claim 13, wherein the control circuit in the second operation mode operates, based on the logic level of the second selection signal, one of the first and second amplifiers and one of the third and fourth amplifiers in parallel.

18. The semiconductor device as claimed in claim 10, further comprising a mode setting circuit that selects one of the first and second operation modes.

19. The semiconductor device as claimed in claim 10, wherein
the first operation mode is an operation mode for serially outputting the first to fourth output signals, and
the second operation mode is an operation mode for serially outputting the first and third output signals, or the second and fourth output signals.

20. A semiconductor device comprising:
a memory cell array;
a plurality of amplifiers that amplifies a plurality of read data that are read in parallel from the memory cell array based on a first portion of an address signal;
a first transfer circuit that transfers, in a time sharing manner, a plurality of read data including at least first and second read data corresponding to a first value of a second portion of the address signal, among the plurality of read data amplified by the amplifiers;
a second transfer circuit that transfers, in a time sharing manner, a plurality of read data including at least third and fourth read data corresponding to a second value of the second portion of the address signal, among the plurality of read data amplified by the amplifiers; and
a multiplex circuit that sequentially outputs, based on a value of the second portion of the address signal, the plurality of read data that are output at least from the first and second transfer circuits, wherein
the first transfer circuit includes a plurality of pipeline circuits including at least a first pipeline circuit and a second pipeline circuit having a larger number of stages than the first pipeline circuit, and a switch circuit that exclusively supplies the plurality of read data including the first and second read data to the plurality of pipeline circuits including the first and second pipeline circuits, respectively, based on a third portion of the address signal,
the second transfer circuit includes a plurality of pipeline circuits including at least a third pipeline circuit and a fourth pipeline circuit having a larger number of stages than the third pipeline circuit, and a switch circuit that exclusively supplies the plurality of read data including the third and fourth read data to the plurality of pipeline circuits including the third and fourth pipeline circuits, respectively, based on the third portion of the address signal,
the first to fourth pipeline circuits are activated when a first operation mode is selected, and
the first and third pipeline circuits are activated, and the second and fourth pipeline circuits are inactivated when a second operation mode is selected.

21. The semiconductor device as claimed in claim 20, wherein
the amplifiers operate in parallel in the first operation mode, and
some of the amplifiers operate in parallel in the second operation mode.

22. The semiconductor device as claimed in claim 21, wherein some of the amplifiers, selected from the amplifiers based on the third portion of the address signal, operate in parallel in the second operation mode.

23. The semiconductor device as claimed in claim 20, wherein
the first operation mode is an operation mode for serially outputting all of the plurality of read data, and
the second operation mode is an operation mode for serially outputting some of the plurality of read data.

24. The semiconductor device as claimed in claim 20, wherein
the second portion of the address signal is a first bit included in a column address for selecting bit lines to which each of a plurality of simultaneously selected memory cells included in the memory cell array is connected,
the third portion of the address signal is a second bit included in the column address, and
the first portion of the address signal is remaining bits of the column address.

25. The semiconductor device as claimed in claim 24, wherein
the first bit is a least significant bit in the column address, and
the second bit is a second lowest bit in the column address.

* * * * *